(12) United States Patent
Harada et al.

(10) Patent No.: US 10,825,972 B2
(45) Date of Patent: Nov. 3, 2020

(54) SEMICONDUCTOR LIGHT-EMITTING APPARATUS HAVING LIGHT REFLECTION ADJUSTING MEMBER OF GRAY RESIN AND ITS MANUFACTURING METHOD

(71) Applicant: STANLEY ELECTRIC CO., LTD., Tokyo (JP)

(72) Inventors: Mitsunori Harada, Tokyo (JP); Kaori Tachibana, Tokyo (JP); Satoshi Ando, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/373,317

(22) Filed: Apr. 2, 2019

(65) Prior Publication Data
US 2019/0312187 A1  Oct. 10, 2019

(30) Foreign Application Priority Data
Apr. 4, 2018  (JP) .................. 2018-072290

(51) Int. Cl.
*H01L 33/60* (2010.01)
*H01L 25/075* (2006.01)
*H01L 33/50* (2010.01)

(52) U.S. Cl.
CPC .......... *H01L 33/60* (2013.01); *H01L 25/0753* (2013.01); *H01L 33/502* (2013.01); *H01L 33/507* (2013.01); *H01L 2933/0041* (2013.01); *H01L 2933/0058* (2013.01)

(58) Field of Classification Search
CPC ..... H01L 33/00–648; H01L 27/15–156; H01L 2933/00–0091; H01L 51/5271; H01L 33/10–105; G09G 2300/0456; H05B 33/24; F21K 9/68
See application file for complete search history.

(56) References Cited

U.S. PATENT DOCUMENTS

2017/0154880 A1 * 6/2017 Ozeki .................. H01L 24/97

FOREIGN PATENT DOCUMENTS

| JP | 2010-219324 A | 9/2010 |
| JP | 2014-082525 A | 5/2014 |

* cited by examiner

*Primary Examiner* — Tucker J Wright
(74) *Attorney, Agent, or Firm* — Kenealy Vaidya LLP

(57) ABSTRACT

A semiconductor light-emitting apparatus is constructed by a wiring substrate, at least one semiconductor light-emitting element provided on the wiring substrate, at least one wavelength-converting member provided on the semiconductor light-emitting element, and a light reflection adjusting member directly covering a sidewall of the semiconductor light-emitting element and a sidewall of the wavelength-converting member. The light reflection adjusting member is formed of gray resin including light reflecting fillers and light absorbing fillers for visible light.

18 Claims, 14 Drawing Sheets

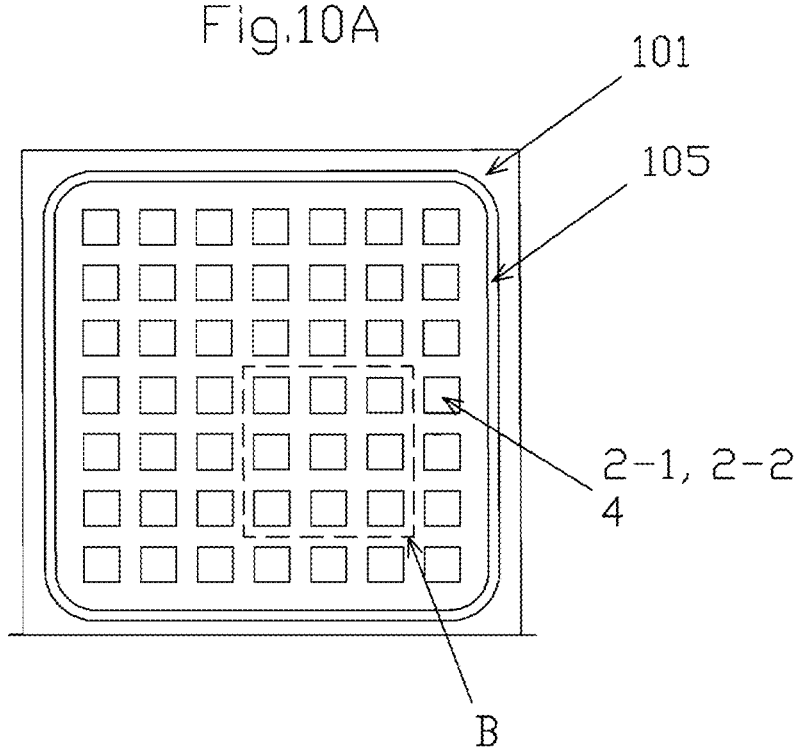
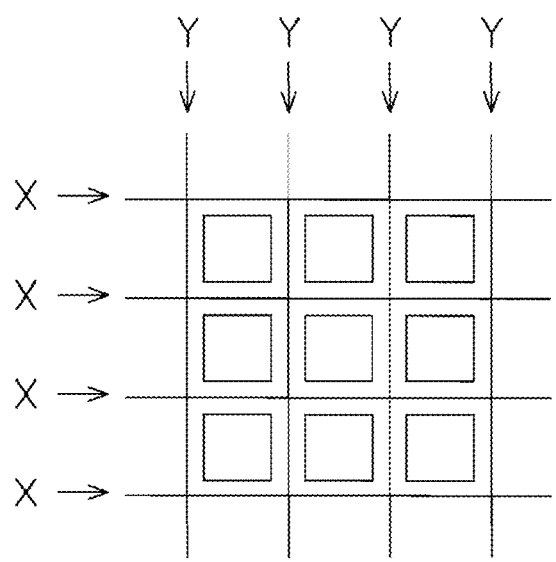

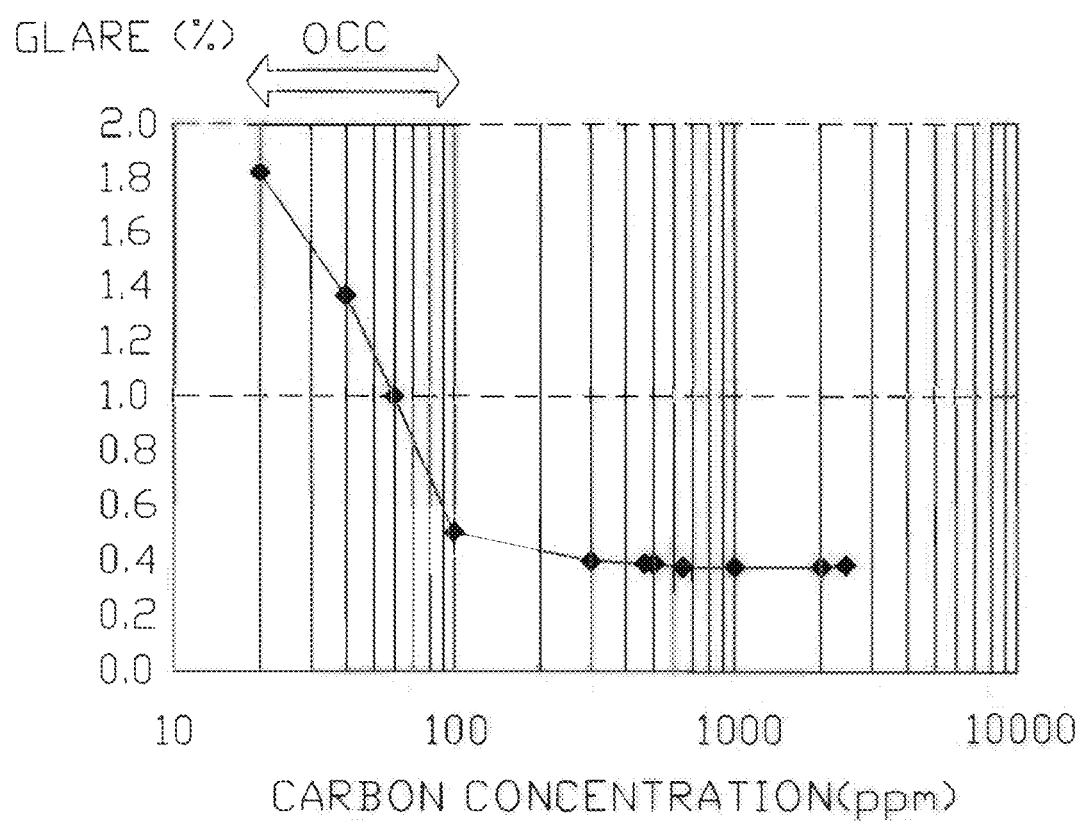

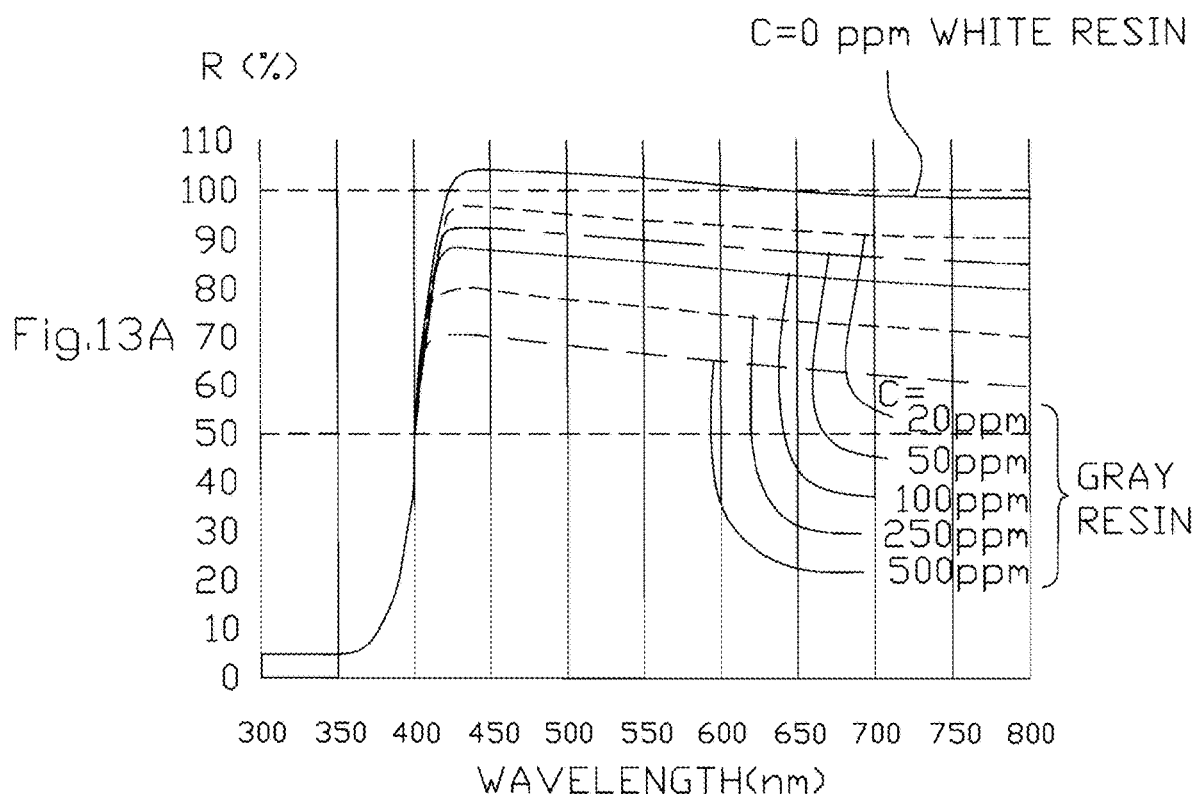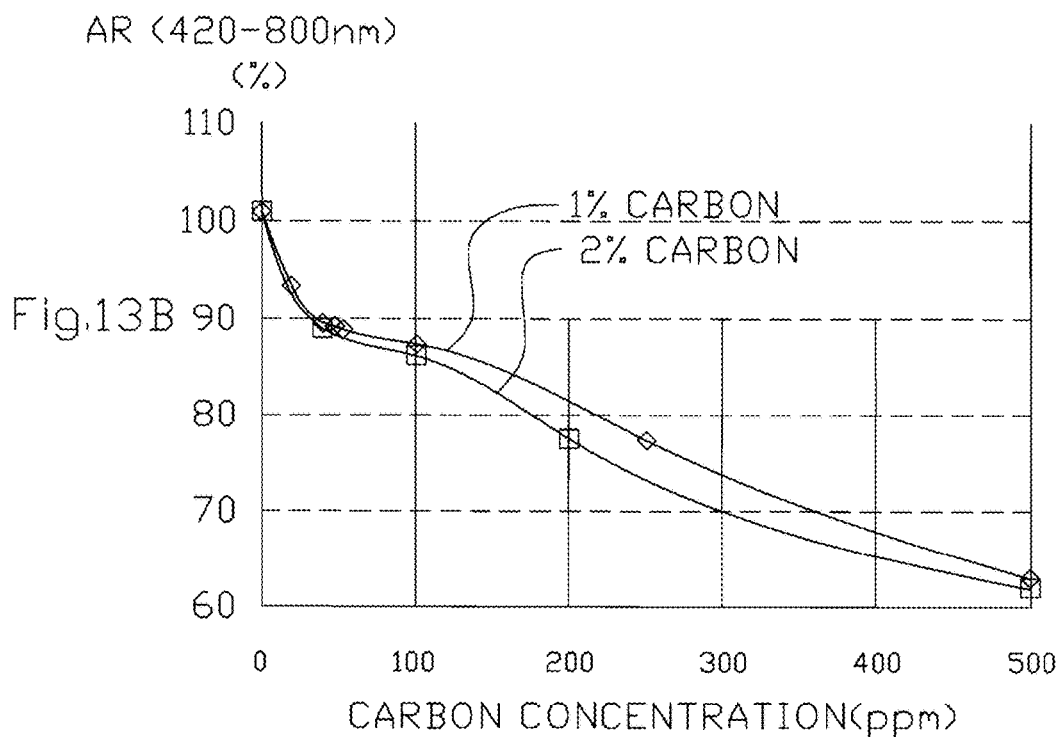

SEMICONDUCTOR LIGHT-EMITTING APPARATUS HAVING LIGHT REFLECTION ADJUSTING MEMBER OF GRAY RESIN AND ITS MANUFACTURING METHOD

This application claims the priority benefit under 35 U.S.C. § 119 to Japanese Patent Application No. JP2018-072290 filed on Apr. 4, 2018, which disclosure is hereby incorporated in its entirety by reference.

BACKGROUND

Field

The presently disclosed subject matter relates to a semiconductor light-emitting apparatus such as a white-light light-emitting diode (LED) apparatus and its manufacturing method.

Description of the Related Art

Generally, a semiconductor light-emitting apparatus such as a white-light LED apparatus is used as an illumination apparatus such as a vehicle headlamp, a street lamp or a conventional lamp.

A first prior art white-light LED apparatus is constructed by a wiring substrate, a blue-light LED element provided on the substrate, a wavelength-converting member made of phosphor provided on the upper surface of the blue-light LED element for converting a part of the blue light emitted by the blue-light LED element into wavelength-converted light such as yellow light with a longer wavelength than that of the emitted blue light of the blue-light LED element, thereby mixing light directly emitted from the blue-light LED element with the yellow light into desired light such as white light, and a coverage member formed of a light reflecting member made of white resin covering the sidewalls of the blue-light LED element and the wavelength-converting member for confining the light emitted from the blue-light LED element into the wavelength-converting member, thus realizing a color evenness characteristic (see: JP2010-219324A).

In the above-described first prior art white-light LED apparatus, however, the light strayed in the light reflecting member is not completely absorbed therein, so that a leakage of light (glare) from a non-light-emitting area surrounding a light-emitting area viewed from the top during an operation mode of the first prior art white-light LED apparatus would be increased.

In a second prior art white-light LED apparatus, a light absorbing member made of black resin surrounding the light reflecting member is added to the first prior art white-light LED apparatus (see: JP2014-082525A). In this case, the light reflecting member is skirt-shaped or fillet-shaped. That is, the coverage member is formed of the light reflecting member (white resin) and the light absorbing member (black resin).

In the above-described second prior art white-light LED apparatus, the light strayed in the light reflecting member (white resin) is absorbed by the light absorbing member (black resin), which would decrease the leakage of light (glare) from the non-light-emitting area viewed from the top during an operation mode of the second prior art white-light LED apparatus.

In the above-described second prior art white-light LED apparatus, however, the thickness of the light reflecting member adjacent to the wavelength-converting member is small due to the presence of the light absorbing member, so that the reflectivity of the light reflecting member is decreased. As a result, the luminous intensity of the light-emitting area viewed from the top during the operation mode of the second prior art white-light LED apparatus would be decreased.

Also, in the above-described second prior art LED apparatus, the light absorbing member is close to the wavelength-converting member, so that light from the sidewall of the wavelength-converting member is absorbed by the light absorbing member, which also would decrease the luminous intensity of the light-emitting area viewed from the top during the operation mode of the second prior art white-light LED apparatus.

SUMMARY

The presently disclosed subject matter seeks to solve the above-described problems.

According to the presently disclosed subject matter, a semiconductor light-emitting apparatus includes a wiring substrate, at least one semiconductor light-emitting element provided on the wiring substrate, at least one wavelength-converting member provided on the semiconductor light-emitting element, and a light reflection adjusting member directly covering a sidewall of the semiconductor light-emitting element and a sidewall of the wavelength-converting member. The light reflection adjusting member is formed of gray resin including light reflecting fillers and light absorbing fillers for visible light.

Also, a method for manufacturing the above-mentioned semiconductor light-emitting apparatus includes preparing white resin including light reflecting fillers, preparing black resin including light absorbing fillers, preparing alight reflection adjusting member of gray resin by mixing the white resin with the black resin, mounting a semiconductor light-emitting element on a wiring substrate, adhering a wavelength-converting member by a transparent adhesive layer to the semiconductor light-emitting element, and directly covering a sidewall of the semiconductor light-emitting element and a sidewall of the wavelength-converting member.

According to the presently disclosed subject matter, the light leakage (glare) in a non-light-emitting area surrounding a light-emitting area can be suppressed.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIG. 10A is a plan view for explaining a method for manufacturing the white-light LED apparatus of FIGS. 9A and 9B;

FIG. 10B is a partial enlargement of 10A surrounded by a dotted line B in FIG. 10A;

FIG. 11 is a graph showing a carbon concentration relative to glare characteristic of the light reflection adjusting member of FIGS. 4A and 4B;

FIG. 13A is a graph showing the reflectivity characteristic of the cured surface of the light reflection adjusting member of FIGS. 4A and 4B;

FIG. 13B is a graph showing the average reflectivity characteristic of the cured surface of the light reflection adjusting member of FIGS. 4A and 4B.

DETAILED DESCRIPTION OF EXEMPLARY EMBODIMENTS

Figure 1A:
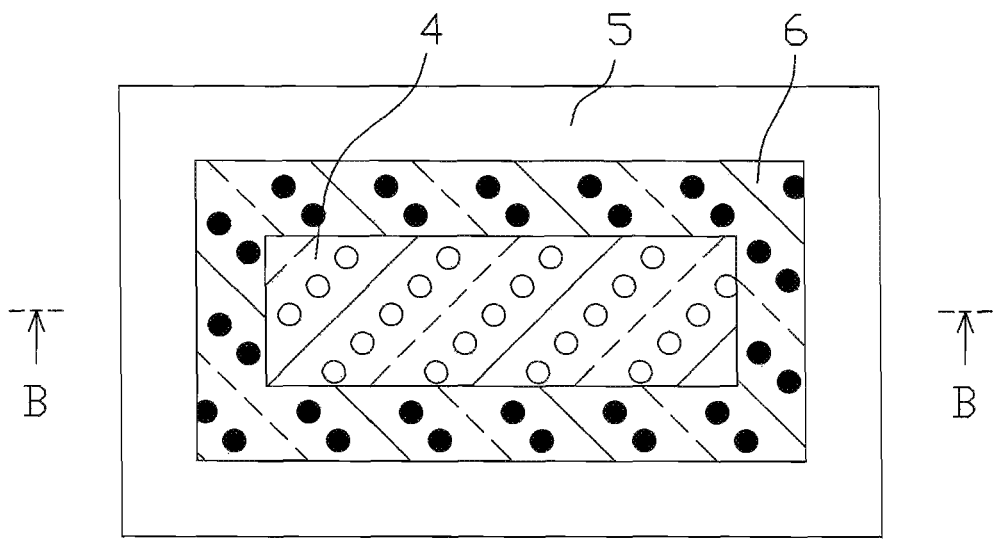
FIG. 1A is a plan view illustrating a first embodiment of the white-light LED apparatus according to the presently disclosed subject matter.
Figure 1B:
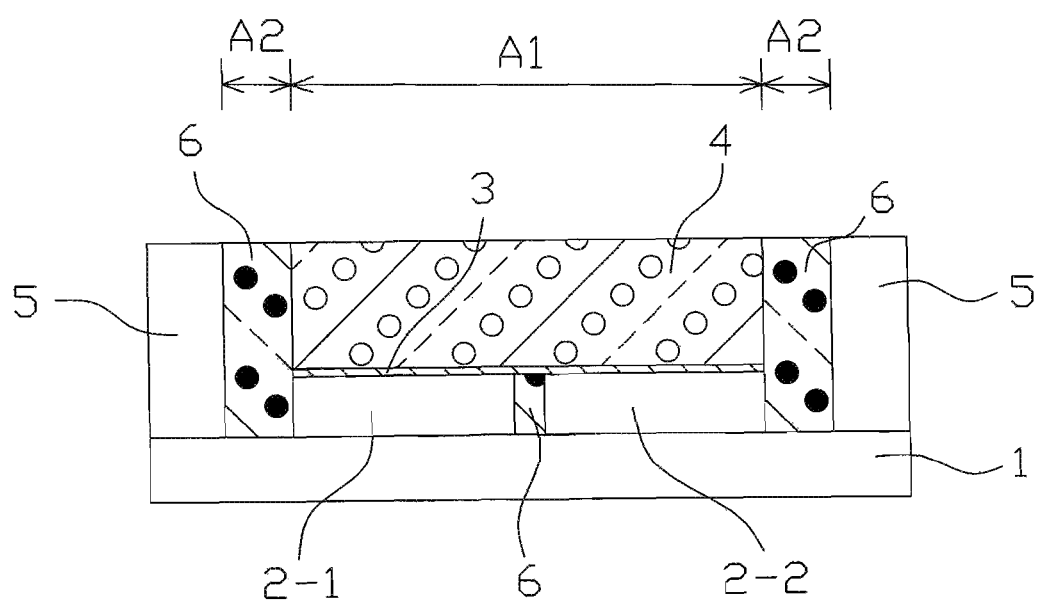
FIG. 1B is a cross-sectional view taken along the line B-B in FIG. 1A.

FIG. 1A is a plan view illustrating a first embodiment of the white-light LED apparatus according to the presently disclosed subject matter, and FIG. 1B is a cross-sectional view taken along the line B-B in FIG. 1A.

In FIGS. 1A and 1B, the white-light LED apparatus is constructed by a wiring substrate 1, two blue-light LED elements 2-1 and 2-2 mounted on the wiring substrate 1, a wavelength-converting element (plate) 4 adhered via a transparent adhesive layer 3 to the blue-light LED elements 2-1 and 2-2, a frame 5 surrounding the peripheries of the blue-light LED elements 2-1 and 2-2 and the wavelength-converting member 4, and a coverage member of a light reflection adjusting member 6 provided between the blue-light LED elements 2-1 and 2-2 and the frame 5 and between the wavelength-converting element 4 and the frame 5. That is, the light reflection adjusting member 6 directly covers the sidewalls of the blue-light LED elements 2-1 and 2-2 and the wavelength-converting element 4. Also, the light reflection adjusting member 6, which may, in this case, be replaced by a white resin layer, is provided between the blue-light LED elements 2-1and 2-2, to suppress the reduction of the luminous intensity between the blue-light LED elements 2-1 and 2-2.

The substrate 1 is made of AlN ceramic, for example.

The blue-light LED elements 2-1 and 2-2 may be electrically connected either in series with each other or in parallel with each other.

The blue-light LED elements 2-1 and 2-2 are constructed by an epitaxially-grown structure including a p-type semiconductor layer, an active layer and an n-type semiconductor layer.

The transparent adhesive layer 3 is made of silicone resin, epoxy resin, acryl resin polycarbonate resin or the like.

The wavelength-converting plate 4 is constructed by a transparent resin plate made of silicone resin or epoxy resin into which phosphor such as $Y_3Al_5O_{12}:Ce^{+3}$ (YAG) is dispersed, a phosphor-coated glass plate or a phosphor sintered alumina ceramic plate, to convert blue light into yellow light. The size of the wavelength-converting member 4 is about the same as that of the blue-light LED elements 2-1 and 2-2 including the gap therebetween viewed from the top. Therefore, most of the light emitted from the blue-light LED elements 2-1 and 2-2 is introduced into the wavelength-converting member 4.

The light reflection adjusting member 6 is made of gray resin where a small amount of light-absorbing black resin having a light absorbing characteristic for visible light is added to a large amount of light-reflecting white resin having a light reflecting characteristic for visible light, exhibiting both light reflecting and absorbing functions.

The light reflection adjusting member 6 is made of gray resin including white resin where 25 wt % titanium oxide is mixed as light reflecting fillers with silicone resin, for example, and black resin where 1 wt % carbon black is mixed as light absorbing fillers with silicone resin, for example. In this case, the white resin and the black resin are mixed with a weight ratio of 99.5:0.5 to form the light reflection adjusting member 6, thus exhibiting a gray light characteristic. The cured gray resin has a diffuse reflectivity of 89%. Note that the light reflection adjusting member 6 can be formed by adding a predetermined amount of titanium oxide and a predetermined amount of carbon black to silicone resin, simultaneously.

Figure 2A:
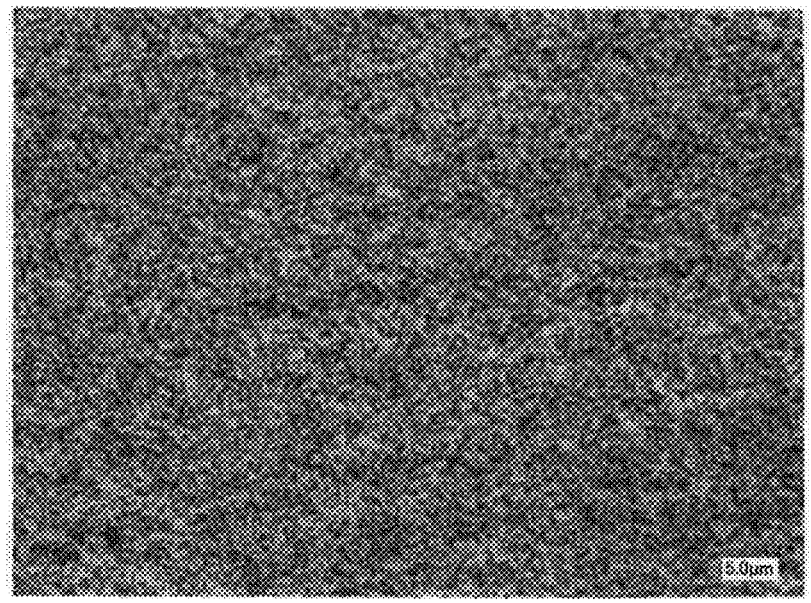
FIG. 2A is an optical microscopic picture of texture of the black resin prepared for the light reflection adjusting member of FIGS. 1A and 1B.
Figure 2B:
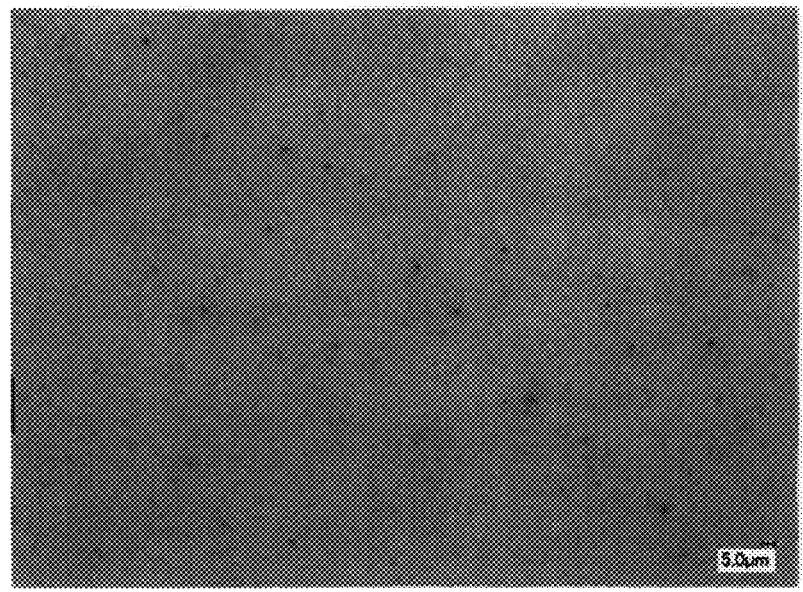
FIG. 2B is an optical microscopic picture of texture of the gray resin prepared for the light reflection adjusting member of FIGS. 1A and 1B.

FIG. 2A is an optical microscopic picture of black resin prepared in advance, and FIG. 2B is an optical microscopic picture of gray resin obtained by using the black resin of FIG. 2A.

In FIG. 2A, which shows black resin where 1 wt % carbon black is added to silicone resin, one primary chain-structured aggregate composed of several 10 to 100 nm carbon particles has a size of 50 to 1 μm, and multiple primary chain-structured aggregates are aggregated by a physical force such as a van der Waals force into one secondary chain-structured aggregate with a size of several μm to absorb 380 to 780 nm visible light.

Figure 3:
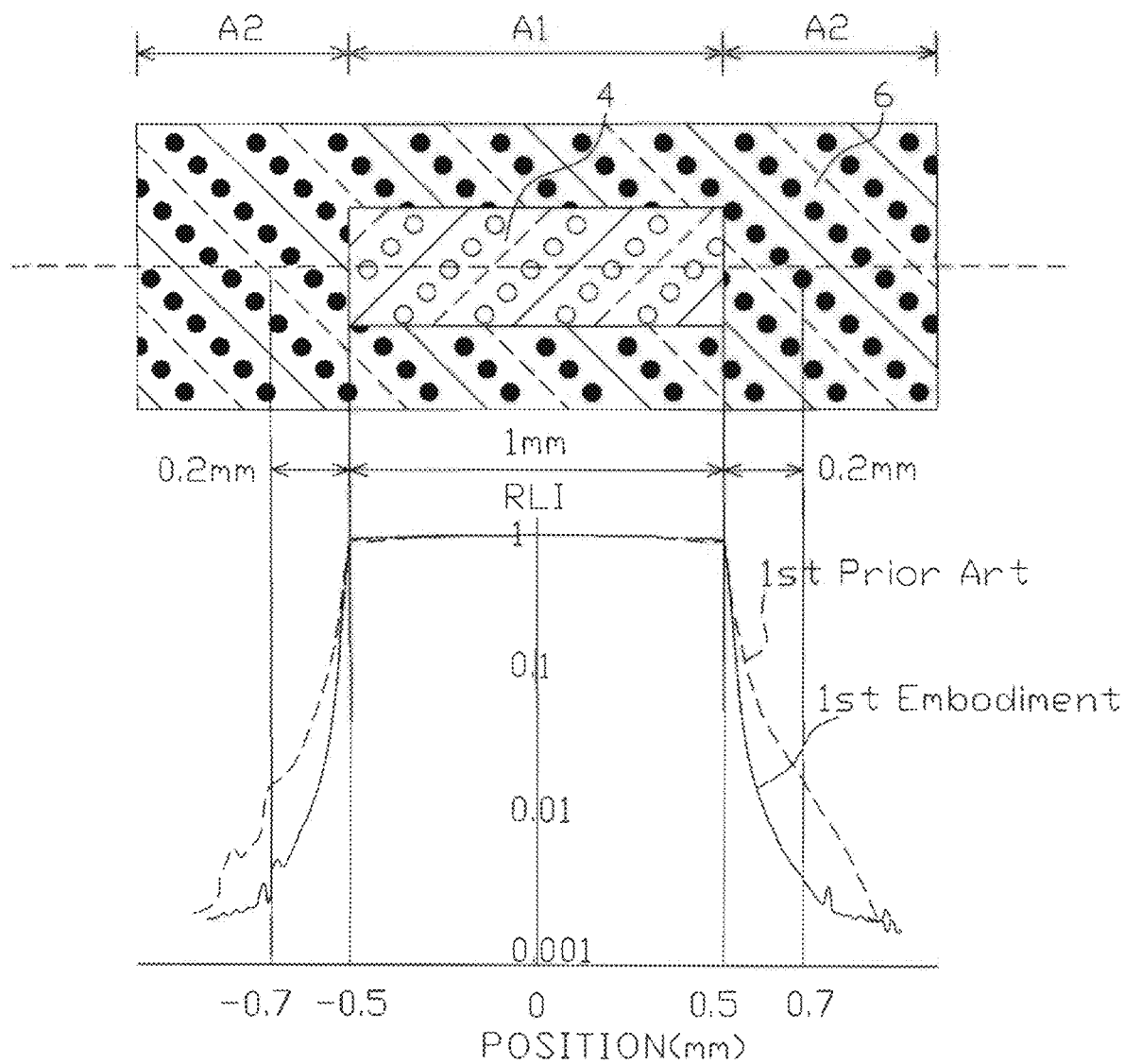
FIG. 3 is a diagram for showing the relative luminous intensity distribution of the white-light LED apparatus of FIGS. 1A and 1B.

As explained above, the light reflection adjusting member 6 exhibits a light reflecting function by titanium oxide for visible light, and also, a light absorbing function by carbon black for visible light. As a result, the light absorbing function can be exhibited without deteriorating the light reflecting function. Thus, as illustrated in FIG. 3, during an operation mode of the blue-light LED elements 2-1 and 2-2, the relative luminous intensity RLI is hardly reduced in a light-emitting area A1 defined by the wavelength-converting element 4, while the relative luminous intensity RLI is reduced in a non-light-emitting area A2. As a result, the glare in the non-light-emitting area A2 surrounding the light-emitting area A1 can be suppressed. In FIG. 3, the size of the light reflection adjusting member 6 is exaggerated.

A method for manufacturing the white-light LED apparatus of FIGS. 1A and 1B is as follows. Note that gray resin is prepared in advance by mixing white resin of silicone resin including 25 wt % titanium oxide with black resin of silicone resin including 1 wt % carbon black. First, blue-light LED elements 2-1 and 2-2 are mounted on a wiring substrate 1. Next, a wavelength-converting member (plate) 4 is adhered by a transparent adhesive layer 3 on the blue-light LED elements 2-1 and 2-2. Next, a frame 5 is adhered by adhesives (not shown) on the periphery of the wiring substrate 1. Finally, gray resin is coated and buried between the blue-light LED elements 2-1 and 2-2 and the frame 5, between the blue-light LED elements 2-1 and 2-2, and between the wavelength-converting member (plate) 4 and the frame 5. Thus, the white-light LED apparatus of FIGS. 1A and 1B is completed.

In FIGS. 1A and 1B, note that the number of blue-light LED elements can be 1, 3 or more.

Figure 4A:
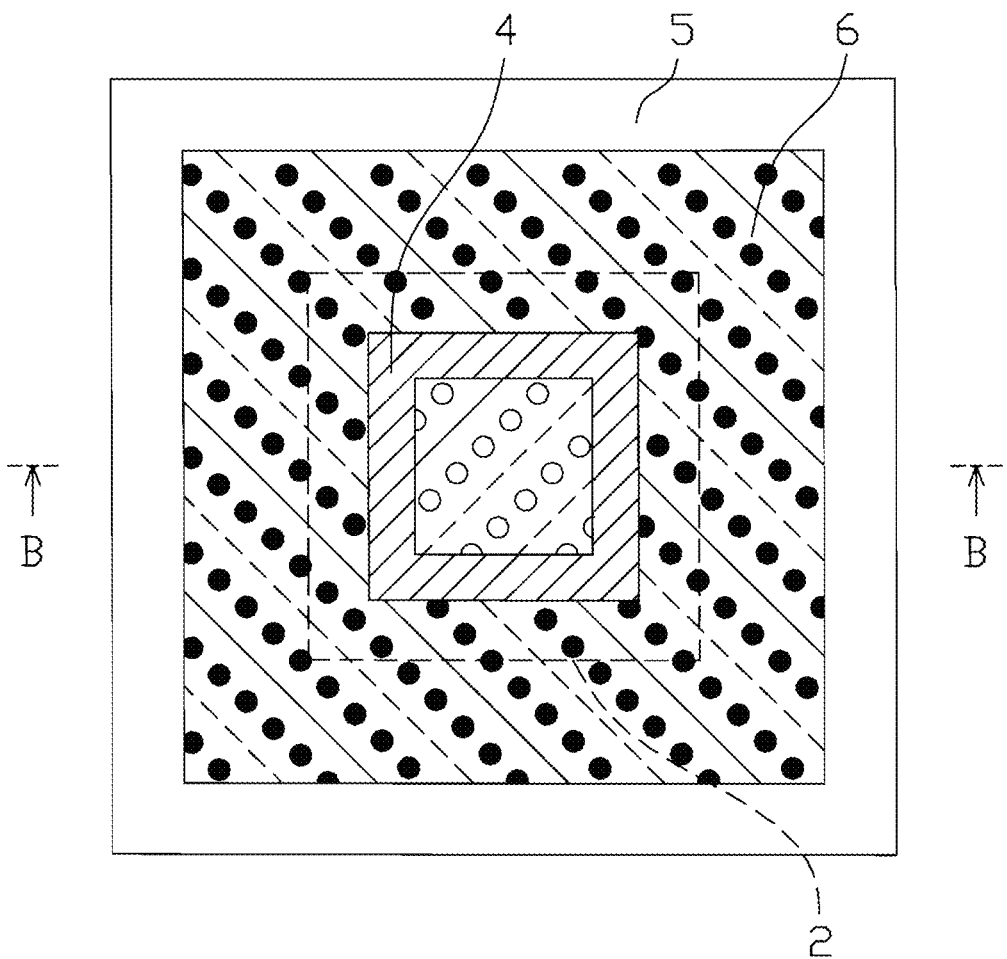
FIG. 4A is a plan view illustrating a second embodiment of the white-light LED apparatus according to the presently disclosed subject matter.
Figure 4B:
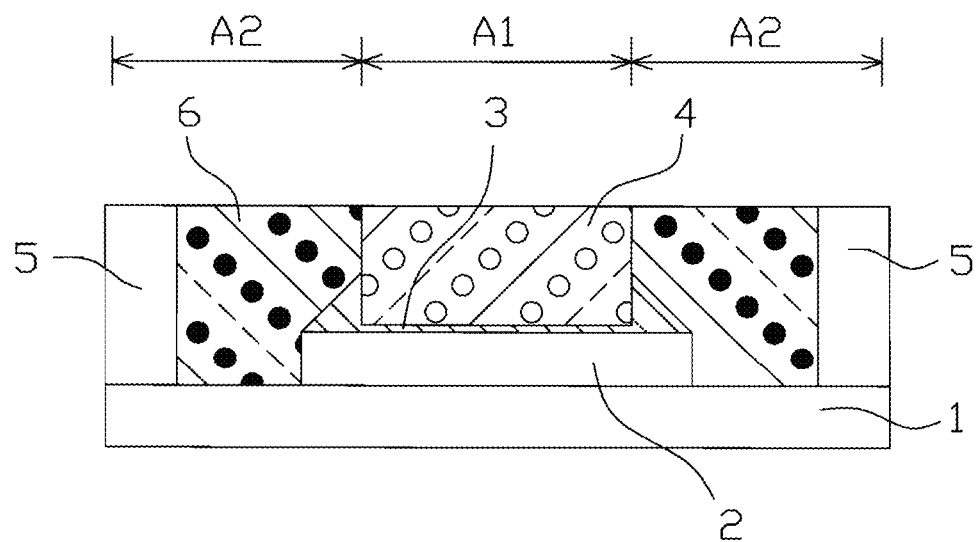
FIG. 4B is a cross-sectional view taken along the line B-B in FIG. 4A.

FIG. 4A is a plan view illustrating a second embodiment of the white-light LED apparatus according to the presently disclosed subject matter, and FIG. 4B is a cross-sectional view taken along the line B-B in FIG. 4A.

In FIGS. 4A and 4B, the blue-light LED elements 2-1 and 2-2 of FIGS. 1A and 1B are replaced by one blue-light LED element 2, and the size of the wavelength-converting member (plate) 4 is smaller than that of the blue-light LED element 2 viewed from the top. In this case, the transparent adhesive layer 3 is skirt-shaped or fillet-shaped to cover a part of the upper surface of the blue-light LED element 2 and a part of the sidewall of the wavelength-converting element 4. Since the size of the wavelength-converting element 4 is smaller than that of the blue-light LED element 2 viewed from the top, the light emitted from the blue-light LED element 2 is effectively introduced via the fillet-shaped transparent adhesive layer 3 into the wavelength-converting element 4, thus realizing a high luminous intensity light-emitting area A1. Even in FIGS. 4A and 4B, during an operation mode of the blue-light LED element 2, the relative luminous intensity RLI is hardly reduced in a light-emitting area A1 defined by the wavelength-converting element 4, while the relative luminous intensity RLI is reduced in a non-light-emitting area A2. As a result, the glare in the non-light-emitting area A2 surrounding the light-emitting area A1 can be suppressed.

A method for manufacturing the white-light LED apparatus of FIGS. 4A and 4B is as follows. Note that gray resin is prepared in advance by mixing white resin of silicone resin including 25 wt % titanium oxide with black resin of silicone resin including 1 wt % carbon black. First, a blue-light LED element 2 is mounted on a wiring substrate 1. Next, a wavelength-converting member (plate) 4 is adhered by a transparent adhesive layer 3 on the blue-light LED element 2. In this case, the transparent adhesive layer 3 is coated on a lower part of the sidewall of the wavelength-converting member (plate) 4. Next, a frame 5 is adhered by adhesives (not shown) on the periphery of the wiring substrate 1. Finally, gray resin is coated and buried between the blue-light LED element 2 and the frame 5 and between the wavelength-converting element 4 and the frame 5. Thus, the white-light LED apparatus of FIGS. 4A and 4B is completed.

In FIGS. 4A and 4B, note that the number of blue-light LED elements can be 2 or more.

Figure 5A:
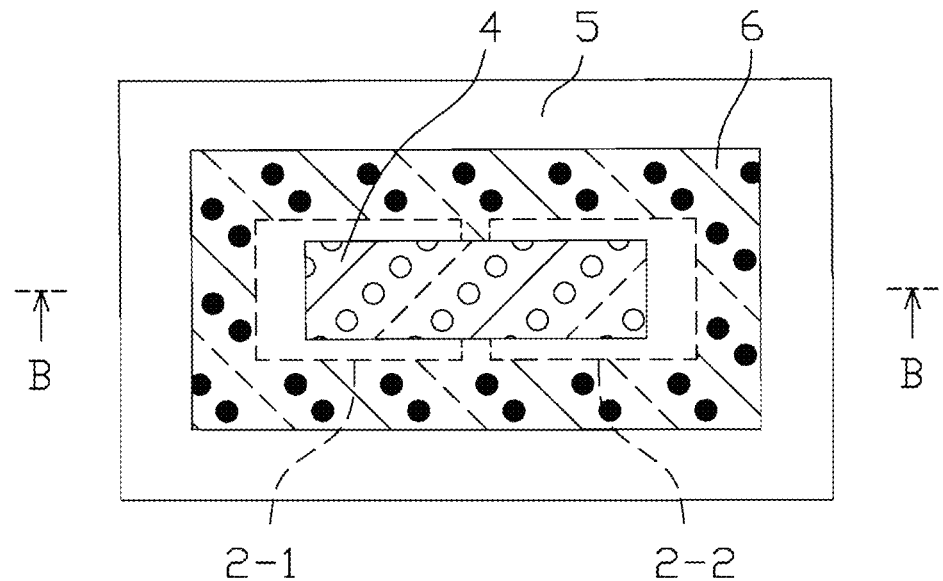
FIG. 5A is a plan view illustrating a third embodiment of the white-light LED apparatus according to the presently disclosed subject matter.
Figure 5B:
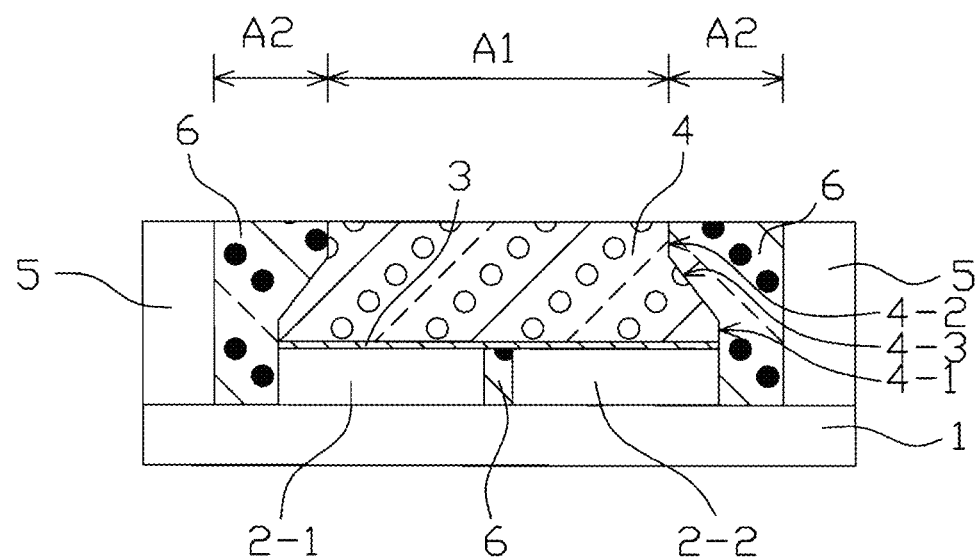
FIG. 5B is a cross-sectional view taken along the line B-B in FIG. 5A.

FIG. 5A is a plan view illustrating a third embodiment of the white-light LED apparatus according to the presently disclosed subject matter, and FIG. 5B is a cross-sectional view taken along the line B-B in FIG. 5A.

In FIGS. 5A and 5B, the wavelength-converting plate 4 is skirt-shaped or fillet-shaped. That is, the size of the lower surface of the wavelength-converting plate 4 is about the same as the size of the light-emitting area A1 of the blue-light LED elements 2-1 and 2-2 including the gap therebetween viewed from the top. On the other hand, the size of the upper surface of the wavelength-converting plate 4 is smaller than that of the blue-light LED elements 2-1 and 2-2 viewed from the top. In more detail, the sidewall of the wavelength-converting plate 4 is constructed by a lower vertical section 4-1 in proximity to the lower surface, an upper vertical section 4-2 in proximity to the upper surface, and a sloped section 4-3 between the lower vertical sections 4-1 and 4-2.

The lower vertical section 4-1, the upper vertical section 4-2 and the sloped section 4-3 of the wavelength-converting plate 4 are dependent upon the cutting method thereof as illustrated in FIGS. 6A, 6B, 6C and 6D.

Figure 6A:
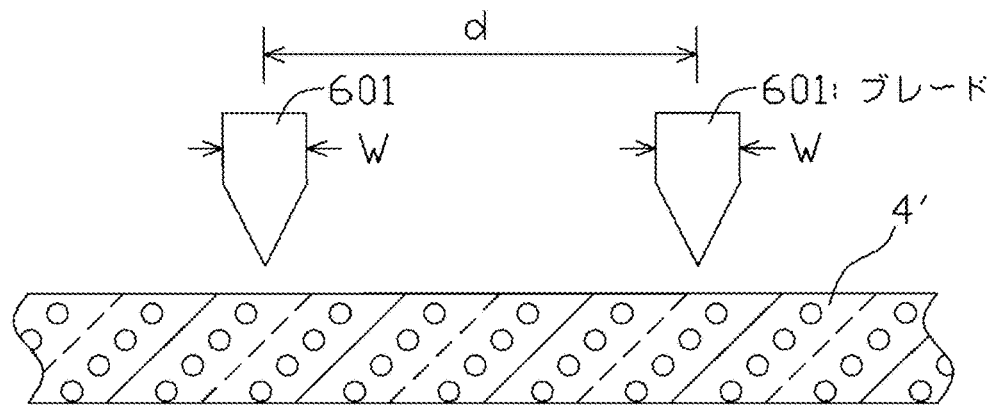
FIGS. 6A, 6B, 6C and 6D are cross-sectional views for explaining a method for cutting the wavelength-converting member of FIGS. 5A and 5B.
Figure 6B:
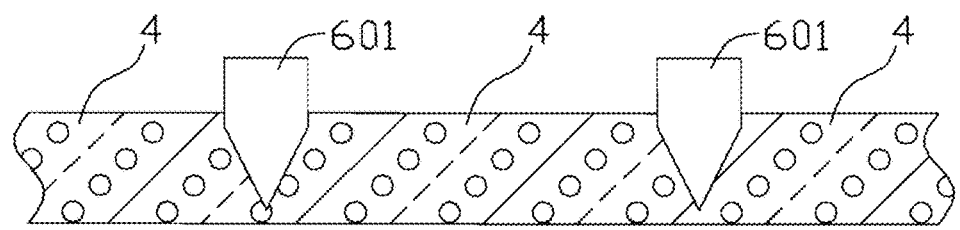
Figure 6C:
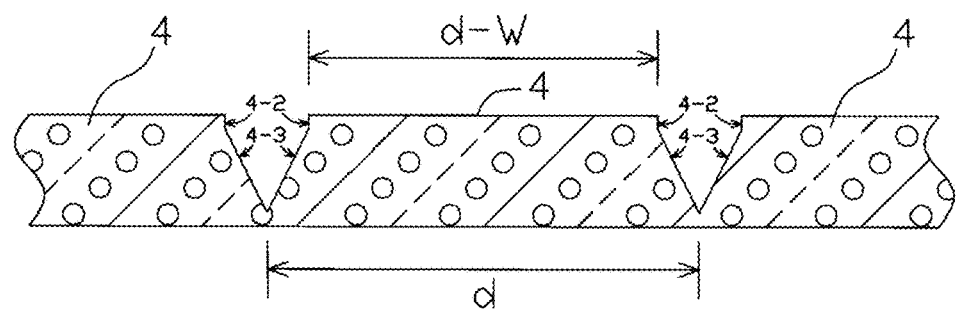
Figure 6D:
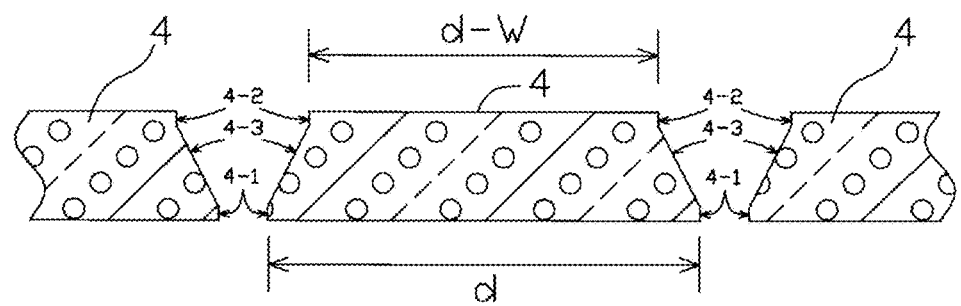

As illustrated in FIGS. 6A and 6B, a flat wavelength-converting member 4' is cut at an interval "d" along a first direction by a blade 601 whose width is "W". As a result, as illustrated in FIG. 6C, wavelength-converting members 4, whose upper length is precisely d-W, are sandwiched by sidewalls each having an upper vertical section 4-2 and a sloped section 4-3. Then, as illustrated in FIG. 6D, the lower portions of the wavelength-converting members 4 are cut by another blade (not shown) whose width is much smaller than "W", so that the wavelength-converting members 4 have sidewalls each having a lower vertical section 4-1. In this case, the lower length of each of the wavelength-converting members 4 is precisely "d". Thus, the wavelength-converting plate 4 has a lower size of "d" and an upper size of "d-W" along the first direction. Similar cutting operations using the blades are performed upon the wavelength-converting plate 4 along a second direction orthogonal to the first direction. Thus, since the wavelength-converting member 4 is skirt-shaped or fillet-shaped, the light emitted from the blue-light LED elements 2-1 and 2-2 are effectively introduced into the wavelength-converting element 4, thus realizing a high luminous intensity light-emitting area A1. Even in FIGS. 5A and 5B, during an operation mode of the blue-light LED elements 2-1 and 2-2, the relative luminous intensity RLI is hardly reduced in a light-emitting area A1 defined by the wavelength-converting element 4, while the relative luminous intensity RLI is reduced in a non-light-emitting area A2. As a result, the glare in the non-light-emitting area A2 surrounding the light-emitting area A1 can be suppressed.

A method for manufacturing the white-light LED apparatus of FIGS. 5A and 5B is as follows. Note that gray resin is prepared in advance by mixing white resin of silicone resin including 25 wt % titanium oxide with black resin of silicone resin including 1 wt % carbon black. First, blue-light LED elements 2-1 and 2-2 are mounted on a wiring substrate 1. Next, a fillet-shaped wavelength-converting member (plate) 4 is adhered by a transparent adhesive layer 3 on the blue-light LED elements 2-1 and 2-2. Next, a frame 5 is adhered by adhesives (not shown) on the periphery of the wiring substrate 1. Finally, gray resin is coated and buried between the blue-light LED elements 2-1 and 2-2 and the frame 5, between the blue-light LED elements 2-1 and 2-2, and between the wavelength-converting element 4 and the frame 5. Thus, the white-light LED apparatus of FIGS. 5A and 5B is completed.

In FIGS. 5A and 5B, note that the number of blue-light LED elements can be 1, 3 or more.

Figure 7A:
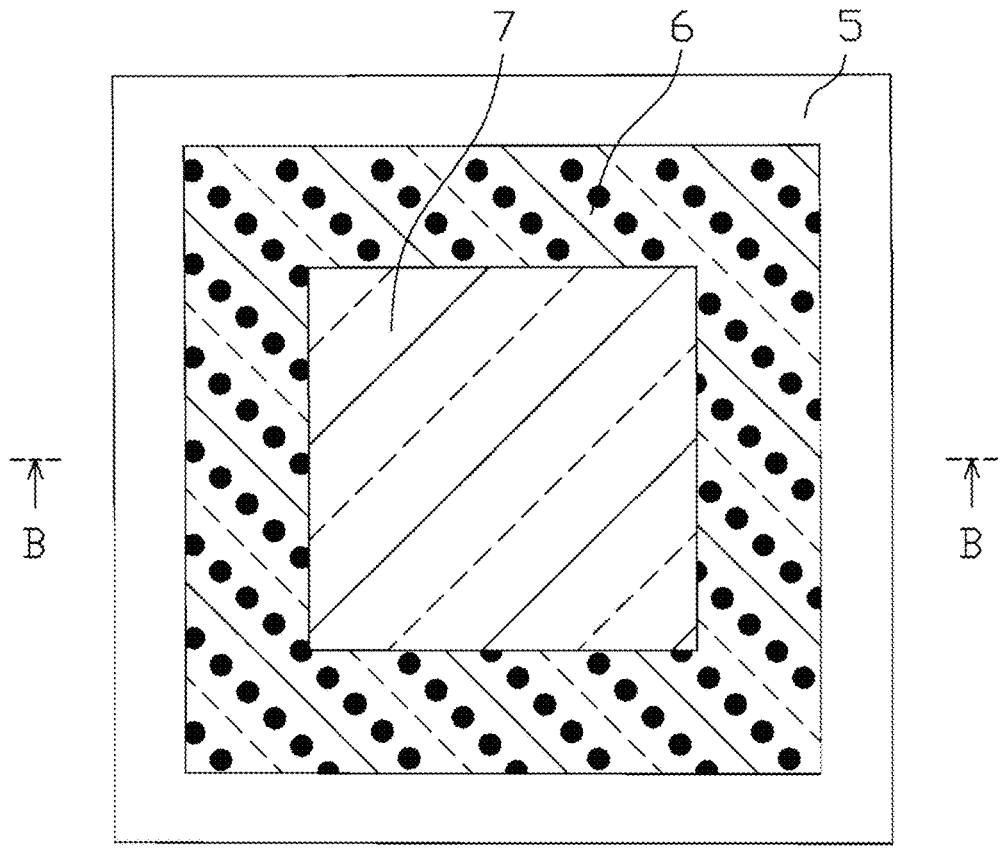
FIG. 7A is a plan view illustrating a fourth embodiment of the white-light LED apparatus according to the presently disclosed subject matter.
Figure 7B:
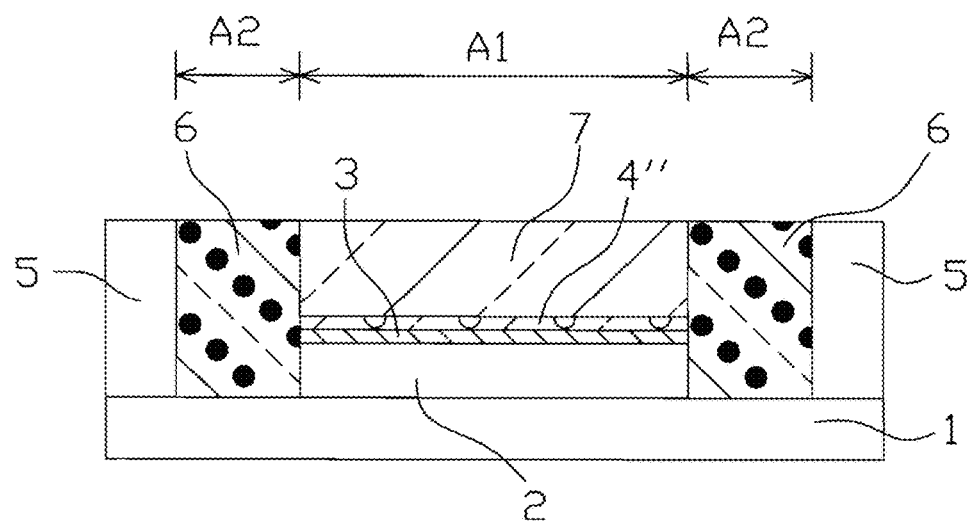
FIG. 7B is a cross-sectional view taken along the line B-B in FIG. 7A.

FIG. 7A is a plan view illustrating a fourth embodiment of the white-light LED apparatus according to the presently disclosed subject matter, and FIG. 7B is a cross-sectional view taken along the line B-B in FIG. 7A.

In FIGS. 7A and 7B, the blue-light LED elements 2-1 and 2-2 of FIGS. 1A and 1B are replaced by one blue-light LED element 2, so that the size of a wavelength-converting member 4" is the same as that of the blue-light LED element 2. Also, a light transparent substrate 7 made of heat-resistant glass or the like is provided on the wavelength-converting member 4". In this case, the wavelength-converting member 4" is constructed by a 20 to 30 µm thick high-density inorganic phosphor layer which is obtained by printing slurry of inorganic binders and phosphor such as YAG on a surface of the light transparent substrate 7 and calcining the slurry in advance. Therefore, the density of phosphor in the wavelength-converting member 4" can be increased. Also, the thickness of the wavelength-converting member 4" can be made uniform by the light transparent substrate 7, so that color unevenness can be suppressed. In this case, since the size of the wavelength-converting element 4" is the same as that of the blue-light LED element 2 viewed from the top, the light emitted from the blue-light LED element 2 is effectively introduced via the transparent adhesive layer 3 into the wavelength-converting element 4", thus realizing a high luminous intensity light-emitting area A1. Even in FIGS. 7A and 7B, during an operation mode of the blue-light LED element 2, the relative luminous intensity RLI is hardly reduced in a light-emitting area A1 defined by the wavelength-converting element 4" and the light transparent substrate 7, while the relative luminous intensity RLI is reduced in a non-light-emitting area A2. As a result, the glare in the non-light-emitting area A2 surrounding the light-emitting area A1 can be suppressed.

A method for manufacturing the white-light LED apparatus of FIGS. 7A and 7B is as follows. Note that gray resin is prepared in advance by mixing white resin of silicone resin including 25 wt % titanium oxide with black resin of silicone resin including 1 wt % carbon black. First, a blue-light LED element 2 is mounted on a wiring substrate 1. Next, a light transparent substrate 7 on which a wavelength-converting member (plate) 4" is formed is adhered by a transparent adhesive layer 3 on the blue-light LED element 2. In this case, the transparent adhesive layer 3 is coated on a lower part of the sidewall of the wavelength-converting member (plate) 4. Next, a frame 5 is adhered by adhesives (not shown) on the periphery of the wiring substrate 1. Finally, gray resin is coated and buried between the blue-light LED element 2 and the frame 5 and between the wavelength-converting element 4 and the frame 5. Thus, the white-light LED apparatus of FIGS. 7A and 7B is completed.

In FIGS. 7A and 7B, note that the number of blue-light LED elements can be 2 or more.

Figure 8A:
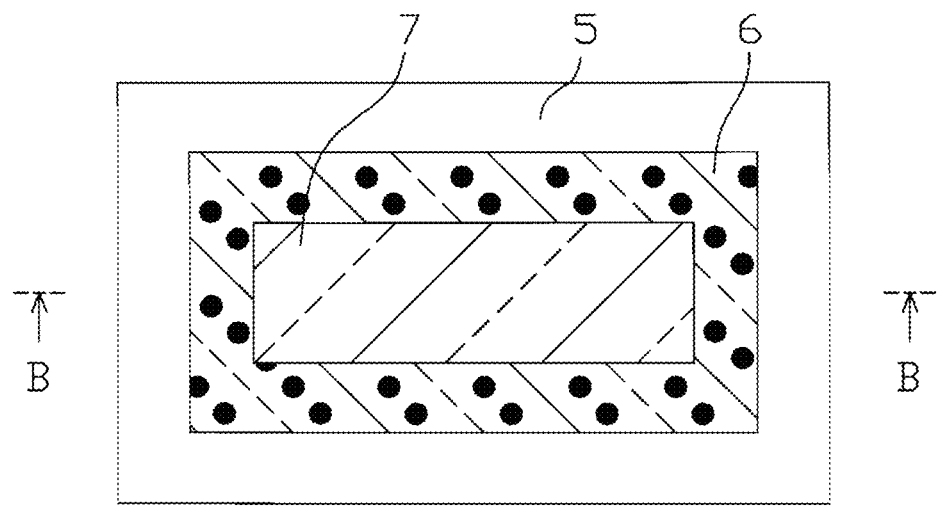
FIG. 8A is a plan view illustrating a fifth embodiment of the white-light LED apparatus according to the presently disclosed subject matter.
Figure 8B:
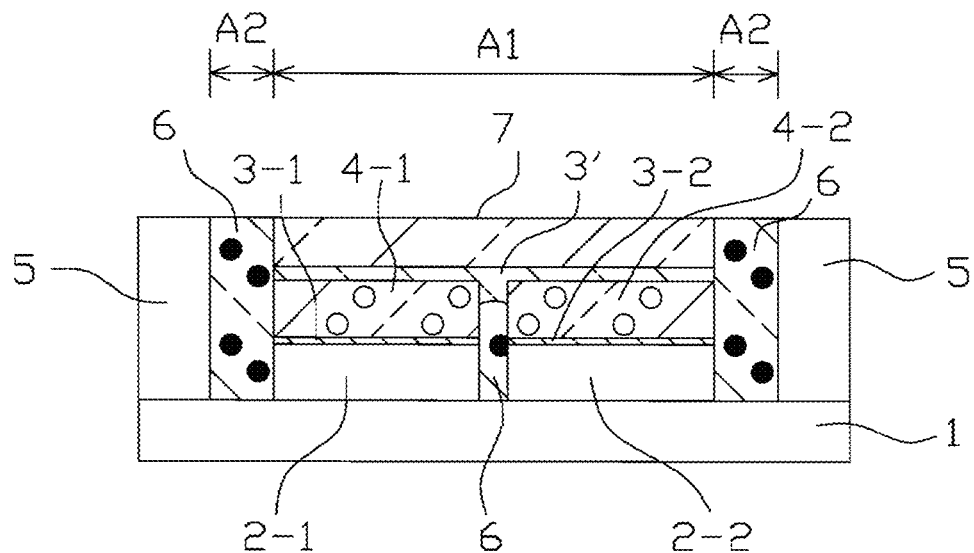
FIG. 8B is a cross-sectional view taken along the line B-B in FIG. 8A.

FIG. 8A is a plan view illustrating a fifth embodiment of the white-light LED apparatus according to the presently disclosed subject matter, and FIG. 8B is a cross-sectional view taken along the line B-B in FIG. 8A.

In FIGS. 8A and 8B, wavelength-converting members (plates) 4-1 and 4-2 are adhered by transparent adhesive layers 3-1 and 3-2 to the blue-light LED elements 2-1 and 2-2, respectively, of FIGS. 1A and 1B. Also, the light reflection adjusting member 6, which may, in this case, be replaced by a white resin layer, is provided between the blue-light LED elements 2-1 and 2-2 and between the wavelength-converting members 4-1 and 4-2 to suppress the reduction of the luminous intensity between the wavelength-converting members 4-1 and 4-2. Further, a light transparent substrate 7 is adhered by a transparent adhesive layer 3' similar to the transparent adhesive layer 3 to the wavelength-converting members (plates) 4-1 and 4-2. As a result, even when the flatness of the blue-light LED element 2-1 is different from that of the blue-light LED elements 2-2 and the flatness of the wavelength-converting member 4-1 is different from that of the wavelength-converting members 4-2, the flatness of a light-emitting area A1 can be defined by the light transparent substrate 7 so that the luminous intensity in the light-emitting area A1 can be made uniform by the light transparent substrate 7. Even in FIGS. 8A and 8B, during an operation mode of the blue-light LED elements 2-1 and 2-2, the relative luminous intensity RLI is hardly reduced in the light-emitting area A1 defined by the wavelength-converting elements 4-1 and 4-2, while the relative luminous intensity RLI is reduced in a non-light-emitting area A2. As a result, the glare in the non-light-emitting area A2 surrounding the light-emitting area A1 can be suppressed.

A method for manufacturing the white-light LED apparatus of FIGS. 8A and 8B is as follows. Note that gray resin is prepared in advance by mixing white resin of silicone resin including 25 wt % titanium oxide with black resin of silicone resin including 1 wt % carbon black. First, blue-light LED elements 2-1 and 2-2 are mounted on a wiring substrate 1. Next, wavelength-converting members (plates) 4-1 and 4-2 are adhered by transparent adhesive layers 3-1 and 3-2 on the blue-light LED elements 2-1 and 2-2, respectively. Next, a light transparent substrate 7 is adhered by a transparent adhesive layer 3' to the wavelength-converting members (plates) 4-1 and 4-2. Next, a frame 5 is adhered by adhesives (not shown) on the periphery of the wiring substrate 1. Finally, gray resin is coated and buried between the blue-light LED elements 2-1 and 2-2 and the frame 5, and between the wavelength-converting members 4-1 and 4-2 and the frame 5, and between the light transparent substrate 7 and the frame 5. Thus, the white-light LED apparatus of FIGS. 8A and 8B is completed.

In FIGS. 8A and 8B, note that the number of blue-light LED elements can be 1, 3 or more.

Figure 9A:
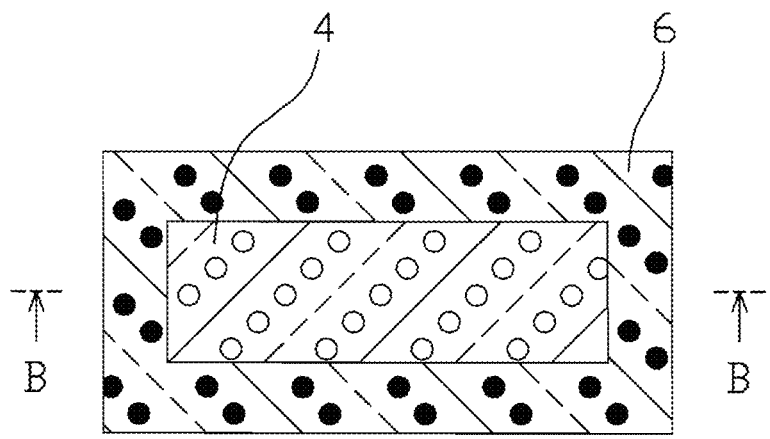
FIG. 9A is a plan view illustrating a modification of the white-light LED apparatus of FIGS. 1A and 1B.
Figure 9B:
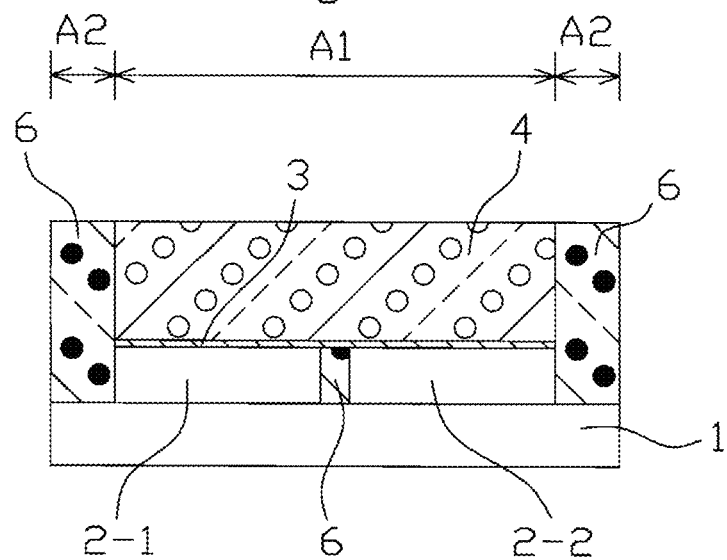
FIG. 9B is a cross-sectional view taken along the line B-B in FIG. 9A.

FIG. 9A is a plan view illustrating a modification of the white-light LED apparatus of FIGS. 1A and 1B, and FIG. 9B is a cross-sectional view taken along the line B-B in FIG. 9A.

In FIGS. 9A and 9B, the frame 5 of FIGS. 1A and 1B is not present.

A method for manufacturing the white-light LED apparatus of FIGS. 9A and 9B is as follows. Note that gray resin is prepared in advance by mixing white resin of silicone resin including 25 wt % titanium oxide with black resin of silicone resin including 1 wt % carbon black. First, referring to FIG. 10A, blue-light LED elements 2-1 and 2-2 are mounted on predetermined positions of a surface wiring substrate 101. Next, wavelength-converting members (plates) 4 are adhered by a transparent adhesive layer 3 on the blue-light LED elements 2-1 and 2-2. Next, an outer frame 105 is adhered by adhesives (not shown) on the periphery of the surface wiring substrate 101. Next, gray resin is coated and buried between the blue-light LED elements 2-1 and 2-2 and the frame 105, between the blue-light LED elements 2-1 and 2-2, and between the wavelength-converting member (plate) 4 and the frame 105. Finally, in a dicing process as illustrated in FIG. 10B, cutting operations are carried out along the lines X and Y. Thus, multiple white-light LED apparatuses of FIGS. 9A and 9B are completed. In this case, the outer frame 105 is excluded from the completed white-light LED apparatuses.

The modification of FIGS. 9A and 9B can be applied to the white-light LED apparatus as illustrated in FIGS. 4A and 4B, FIGS. 5A and 5B, FIGS. 7A and 7B and FIGS. 8A and 8B.

FIG. 11 shows a carbon concentration relative to glare characteristic of the light reflection adjusting member 6 of FIGS. 4A and 4B, the glare (%) is represented by the glare (%)=(the luminous intensity of the non-light-emitting area $A2$ at $a$ distance of 0.2 mm from the edge of the light-emitting area $A1$)/(the average luminous intensity of the light-emitting area $A1$)

As illustrated in FIG. 11, when the carbon concentration is less than 20 ppm, the glare is below 2%, and when the carbon concentration is 100 ppm or more, the reduction of the glare is not observed. Therefore, the optimum carbon concentration 0 CC is 10 to 100 ppm in view of the reduction effect of the glare.

Figure 12:
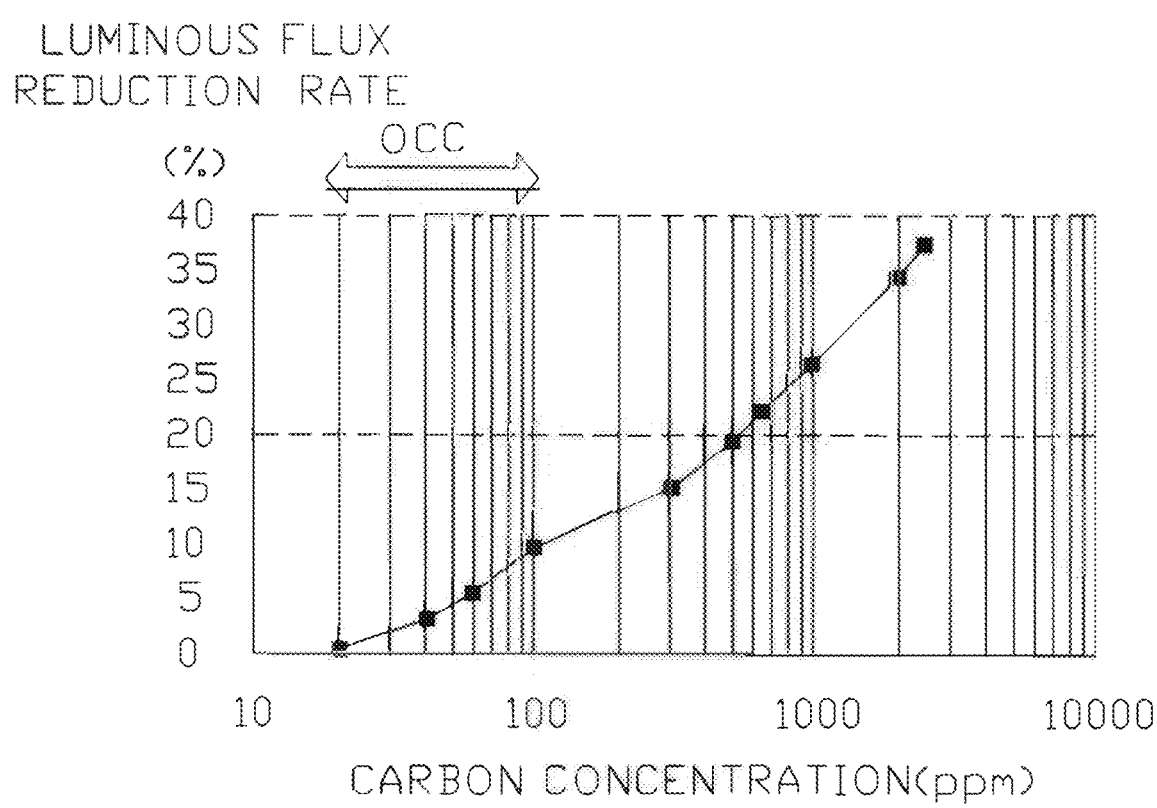
FIG. 12 is a graph showing a carbon concentration relative to luminous flux reduction rate characteristic of the light reflection adjusting member of FIGS. 4A and 4B.

FIG. 12 shows a carbon concentration relative to luminous flux reduction rate characteristic of the light reflection adjusting member 6 of FIGS. 4A and 4B, the glare (%) is represented by the luminous flux reduction rate (%)=1−(the luminous flux of the light-emitting area $A1$)/(the luminous flux of the light-emitting area $A1$ at the zero carbon concentration)

As illustrated in FIG. 12, as the carbon concentration increases, the luminous flux reduction rate increases; in this case, when the carbon concentration is more than 100 ppm, the luminous flux reduction rate rapidly increases. Therefore, the optimum carbon concentration 0 CC is also 10 to 100 ppm in view of the reduction effect of the luminous flux.

As illustrated in FIG. 13A, which shows a reflectivity relative to light wavelength characteristic of the cured surface of the light reflection adjusting member 6 of FIGS. 4A and 4B, when the carbon concentration C is increased from 0 ppm via 20 ppm, 50 ppm, 100 ppm and 250 ppm to 500 ppm, the reflectivity R of the light reflection adjusting member 6 is decreased, and also, as the wavelength of light is increased, the reflectivity R is decreased. In FIG. 13B, which shows an average reflectivity relative to carbon concentration characteristic of the light reflection adjusting member 6 for 420 to 800 nm visible light, the average reflectivity AR using gray resin where black resin with a carbon concentration of 1% is added to silicone resin is substantially the same as the average reflectivity AR using gray resin where black resin with a carbon concentration of 2% is added to silicone resin.

Figure 14:
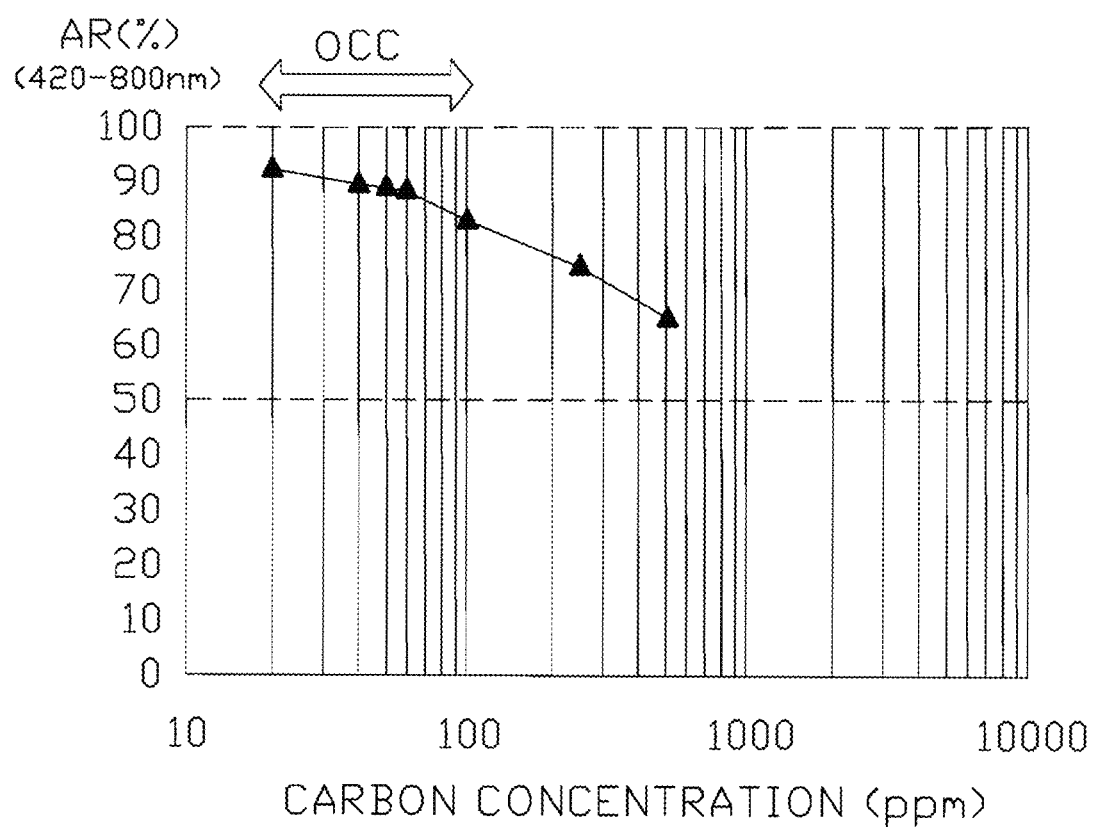
FIG. 14 is a graph showing a carbon concentration relative to average reflectivity characteristic of the light reflection adjusting member of FIGS. 4A and 4B.

In FIG. 14, which shows a carbon concentration relative to average reflectivity characteristic of the light reflection adjusting member 6 of FIGS. 4A and 4B, when the carbon concentration is more than 100 ppm, the average reflectivity AR of the light reflection adjusting member 6 rapidly decreases. Therefore, the optimum carbon concentration 0 CC for reducing the glare is 10 to 100 ppm. In this case, the average reflectivity AR is $65\% \leq AR \leq 95\%$ preferably, $80\% \leq AR \leq 90\%$ As stated above, when gray resin is obtained by a mixture of white resin including 25 wt % titanium oxide and black resin including 1 wt % carbon black with a weight ratio of 99.5:0.5, the carbon concentration C is $1\% \times 0.5\% = 50$ ppm Thus, the optimum carbon concentration 0 CC from 10 to 100 ppm is satisfied, so that the average reflectivity AR of the light-emitting area A1 would satisfy the relationship $65\% \leq AR \leq 95\%$. Generally, if based on a table of the average reflectivity AR of the light-emitting area A1 as a function of the concentration of titanium oxide in the white resin, the concentration of carbon black in the black resin and the weight ratio of the white resin to the black resin is prepared in advance, an arbitrary average reflectivity AR from 65% to 95% can be easily realized.

Note that, in the above-described embodiments, blue-light LED elements are provided; however, other semiconductor light-emitting elements such as other LED elements or laser diode (LD) elements can be provided.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A semiconductor light-emitting apparatus comprising:
   a wiring substrate;
   at least one semiconductor light-emitting element provided on said wiring substrate;
   at least one wavelength-converting member provided on said semiconductor light-emitting element; and
   a light reflection adjusting member directly covering a sidewall of said semiconductor light-emitting element and a sidewall of said wavelength-converting member,
   said light reflection adjusting member comprising gray resin including light reflecting fillers and light absorbing fillers for visible light.

2. The semiconductor light-emitting apparatus as set forth in claim 1, wherein said gray resin is a mixture of white resin including said light reflecting fillers and black resin including said light absorbing fillers.

3. The semiconductor light-emitting apparatus as set forth in claim 1, wherein said light reflecting fillers comprise titanium oxide, and said light absorbing fillers comprise carbon black.

4. The semiconductor light-emitting apparatus as set forth in claim 3, wherein a carbon concentration of said gray resin is 10 to 100 ppm.

5. The semiconductor light-emitting apparatus as set forth in claim 1, wherein said gray resin mainly includes silicone resin.

6. The semiconductor light-emitting apparatus as set forth in claim 2, wherein said white resin mainly includes silicone resin, and said black resin mainly includes silicone resin.

7. The semiconductor light-emitting apparatus as set forth in claim 1, wherein a size of said wavelength-converting member is the same as a size of a light-emitting area of said semiconductor light-emitting element viewed from the top.

8. The semiconductor light-emitting apparatus as set forth in claim 1, wherein a size of said wavelength-converting member is smaller than a size of a light-emitting area of said semiconductor light-emitting element viewed from the top, said wavelength-converting member being adhered by a transparent adhesive layer to said semiconductor light-emitting element, said transparent adhesive layer covering a lower part of the sidewall of said wavelength-converting member.

9. The semiconductor light-emitting apparatus as set forth in claim 1, wherein a lower side of said wavelength-converting member is the same as a size of a light-emitting area of said semiconductor light-emitting element viewed from the top, an upper side of said wavelength-converting member being smaller than the size of a light-emitting area of said semiconductor light-emitting element viewed from the top, the sidewall of said wavelength-converting member comprising a lower vertical section in proximity to said lower side, an upper vertical section in proximity to said upper side, and a sloped section between said lower vertical section and said upper vertical section.

10. The semiconductor light-emitting apparatus as set forth in claim 1, further comprising a light transparent substrate provided on said wavelength-converting member, said light reflection adjusting member covering a sidewall of said light transparent substrate.

11. The semiconductor light-emitting apparatus as set forth in claim 10, wherein said wavelength-converting member comprises an inorganic phosphor layer.

12. The semiconductor light-emitting apparatus as set forth in claim 10, wherein said wavelength-converting member is adhered by a transparent adhesive layer to said light transparent substrate.

13. The semiconductor light-emitting apparatus as set forth in claim 1, wherein said at least one semiconductor light-emitting element comprises multiple semiconductor light-emitting elements, and said at least one wavelength-converting member comprises a single wavelength-converting member.

14. The semiconductor light-emitting apparatus as set forth in claim 1, wherein said at least one semiconductor light-emitting element comprises multiple semiconductor light-emitting elements, and said at least one wavelength-converting member comprises multiple wavelength-converting members each provided on one of said multiple semiconductor light-emitting elements, said semiconductor light-emitting apparatus further comprising a light transparent substrate provided on said multiple wavelength-converting elements.

15. The semiconductor light-emitting apparatus as set forth in claim 1, further comprising a frame provided on said wiring substrate and adapted to surround said light reflection adjusting member.

16. A method for manufacturing a semiconductor light-emitting apparatus as set forth in claim 1, comprising:

preparing white resin including light reflecting fillers;

preparing black resin including light absorbing fillers;

preparing a light reflection adjusting member of gray resin by mixing said white resin with said black resin;

mounting a semiconductor light-emitting element on a wiring substrate;

adhering a wavelength-converting member by a transparent adhesive layer to said semiconductor light-emitting element; and directly covering a sidewall of said semiconductor light-emitting element and a sidewall of said wavelength-converting member.

17. The method as set forth in claim 16, further comprising adhering a light transparent substrate on said wavelength-converting member before said covering, said covering further covering a sidewall of said light transparent substrate.

18. The method as set forth in claim 16, further comprising providing a frame on said wiring substrate before said covering, said frame surrounding said semiconductor light-emitting element and said wavelength-converting member.

* * * * *